US006821026B2

(12) United States Patent
Devine et al.

(10) Patent No.: US 6,821,026 B2
(45) Date of Patent: Nov. 23, 2004

(54) REDUNDANT CONFIGURABLE VCSEL LASER ARRAY OPTICAL LIGHT SOURCE

(75) Inventors: William T. Devine, Ulster Park, NY (US); Jeffrey A. Kash, Pleasantville, NY (US); John U. Knickerbocker, Wappingers Falls, NY (US); Steven P. Ostrander, Wappingers Falls, NY (US); Jeannine M. Trewhella, Peekskill, NY (US); Ronald P. Luijten, Horgen (CH)

(73) Assignee: International Business Machines Corporation, Armonk, NY (US)

( * ) Notice: Subject to any disclaimer, the term of this patent is extended or adjusted under 35 U.S.C. 154(b) by 115 days.

(21) Appl. No.: 10/235,435

(22) Filed: Sep. 4, 2002

(65) Prior Publication Data

US 2004/0042737 A1 Mar. 4, 2004

(51) Int. Cl.[7] ................................................. G02B 6/36
(52) U.S. Cl. .............................. 385/89; 385/90; 385/91; 385/31; 385/88; 385/49; 372/50; 372/43; 372/96
(58) Field of Search .............................. 385/89, 90, 91, 385/31, 88, 49; 372/50, 43, 96

(56) References Cited

U.S. PATENT DOCUMENTS

| 4,651,343 A | | 3/1987 | Laor ........................... 385/16 |
| 5,228,101 A | * | 7/1993 | Lebby et al. .................. 385/91 |
| 5,568,575 A | | 10/1996 | Sato .............................. 385/16 |
| 5,625,480 A | | 4/1997 | Swirhun et al. ............. 398/154 |
| 5,671,304 A | | 9/1997 | Duguay ........................ 385/17 |
| 5,771,320 A | | 6/1998 | Stone ........................... 385/16 |
| 5,812,571 A | | 9/1998 | Peters .......................... 372/36 |
| 5,812,582 A | * | 9/1998 | Gilliland et al. ............... 372/50 |
| 6,049,641 A | | 4/2000 | Deacon et al. ................ 385/15 |
| 6,081,638 A | * | 6/2000 | Zhou ............................ 385/31 |
| 6,084,848 A | | 7/2000 | Goto .......................... 369/121 |
| 6,101,299 A | | 8/2000 | Laor ............................ 385/16 |
| 6,141,465 A | | 10/2000 | Bischel et al. ................. 385/4 |
| 6,229,721 B1 | * | 5/2001 | Mano et al. ............... 363/56.1 |
| 6,233,263 B1 | | 5/2001 | Chang-Hasnain et al. .... 372/32 |

OTHER PUBLICATIONS

Georgiou, et al., "Fault–Tolerant Laser Transmitter Design", IBM Technical Disclosure Bulletin, vol. 36, No. 06A, pp. 375–377, Jun. 1993.
Kuchta, et al., "High Speed Data Communication using 670nm Vertical Cavity Surface Emitting Lasers and Plastic Optical Fiber", pp. 1–6.

* cited by examiner

*Primary Examiner*—Dean A. Reichard
*Assistant Examiner*—Anton Harris
(74) *Attorney, Agent, or Firm*—Scully, Scott, Murphy & Presser; James J. Cioffi, Esq.

(57) ABSTRACT

A redundant configurable VCSEL laser array optical light source which provides for integrating optical communications capabilities into manufacturing processes for a substrate or submount such as a silicon or ceramic substrate, a multi-chip module, a package board, backplane or similar component. Multiple, spatially proximate lasers and photodetectors are provided as part of an optical transmitter or receiver module to simplify assembly of the module, particularly alignment of a laser or photodetector to an optical fiber or waveguide. A feedback loop and control logic select those laser(s) or photodiodes(s) which are most strongly coupled to the transmission medium to produce the best signals. This approach greatly simplifies optical alignment, to improve yield and relax mechanical tolerances, leading to lower assembly costs and higher manufacturing yields.

17 Claims, 2 Drawing Sheets

LOGIC CONTROL OF LASER

BIDIRECTIONAL SYSTEM

REDUNDANT CONFIGURABLE VCSEL LASER ARRAY OPTICAL LIGHT SOURCE

BACKGROUND OF THE INVENTION

1. Field of the Invention

The present invention relates generally to a redundant configurable VCSEL (vertical cavity surface emitting laser) laser array optical light source which is designed to provide for a selection of the best aligned and coupled laser to provide the nest laser signal from an array of surface emitting lasers. More particularly, the present invention pertains to a redundant configurable VCSEL laser array optical light source which provides for integrating optical communications capabilities into existing manufacturing processes, such as manufacturing processes for a substrate or submount such as a silicon or ceramic substrate, a multi-chip module, a package board, backplane or similar component.

2. Discussion of the Prior Art

The prior art has addressed the general concept of providing a fiber guide on an optoelectronic chip. In the early days of LED development, Burrus developed a relatively crude fiber guide for an LED in which a well is etched into an LED, and a butt-coupled fiber is inserted therein and then epoxied in place. A fiber guide fabricated to tighter tolerances than those offered by the Burrus approach is desirable so that a fiber may be aligned more precisely to an optoelectronic chip.

SUMMARY OF THE INVENTION

Accordingly, it is a primary object of the present invention to provide a redundant configurable VCSEL laser array optical light source which provides for integrating optical communications capabilities into manufacturing processes for a substrate or submount such as a silicon or ceramic substrate, a multi-chip module, a package board, backplane or similar component.

The present invention addresses the problem of providing optical connectors from one or more optical sources on a semiconductor laser chip mounted on a substrate or submount. In a typical application, the optical communications may be provided inside a computer and between a backplane and a circuit board or between two circuit boards. A typical optical source is a VCSEL (vertical cavity surface emitting laser) laser array chip comprising an array of VCSELs. The optical path can be provided by an optical fiber, typically glass or plastic, or by an optical waveguide fabricated from a material such as glass or another oxide or nitride or a polymer. The optical path could also be a free space optical path, i.e. consist of a lens or lenses and a transparent medium such as air. The optical detector can typically be a photodiode.

A key problem in the industry, which is addressed and solved by the present invention, is overcoming misalignments introduced in connector systems used to link the optical source(s) or detector(s) to the optical path. In the prior art, an optical fiber is often misaligned with a single laser optical source which is used and limited by the tolerances in the optical connector of whatever form or type. This misalignment has been a recognized major industry problem associated with the use of optics for high speed communications.

The present invention provides a new approach and structure to overcome alignment problems, and is designed to provide for a selection of the best aligned and coupled laser to provide the best laser signal from an array of surface emitting lasers.

The ability to physically fit more than one laser into the core size of a fiber was not heretofore possible, but is now possible as advances in semiconductors outpace reductions in fiber core diameter.

The present invention provides multiple, spatially proximate lasers and photodetectors as part of an optical transmitter or receiver module to simplify assembly of the module. One step in the assembly of the module requires alignment of a laser or photodetector to a transmission medium of the optical link, typically an optical fiber or waveguide. With multiple lasers or photodiodes in near proximity, those laser(s) or photodiodes(s) are selected which are strongly coupled to the transmission medium. Particularly in the case of multichannel modules, this approach greatly simplifies optical alignment, to improve yield and relax mechanical tolerances, leading to lower assembly costs and higher manufacturing yields.

One embodiment of the present invention uses a VCSEL laser array supported by a CMOS logic control chip, both packaged on a multichip module which provides an optical fiber connector/support structure, wherein the connections may be made with less demanding tolerances by virtue of the present invention.

BRIEF DESCRIPTION OF THE DRAWINGS

The foregoing objects and advantages of the present invention for a redundant configurable VCSEL laser array optical light source may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE DRAWINGS

The present invention provides a substrate or submount such as a silicon or ceramic substrate, a multi-chip module, a package board, backplane or similar component with an optical source array such as a VCSEL and/or detector array such as an n×m photodiode array. A selection means is provided to select one or several of the optical sources or detectors in the array that is/are best and most efficiently coupled optically to an optical path such as an optical fiber.

Figure 1:
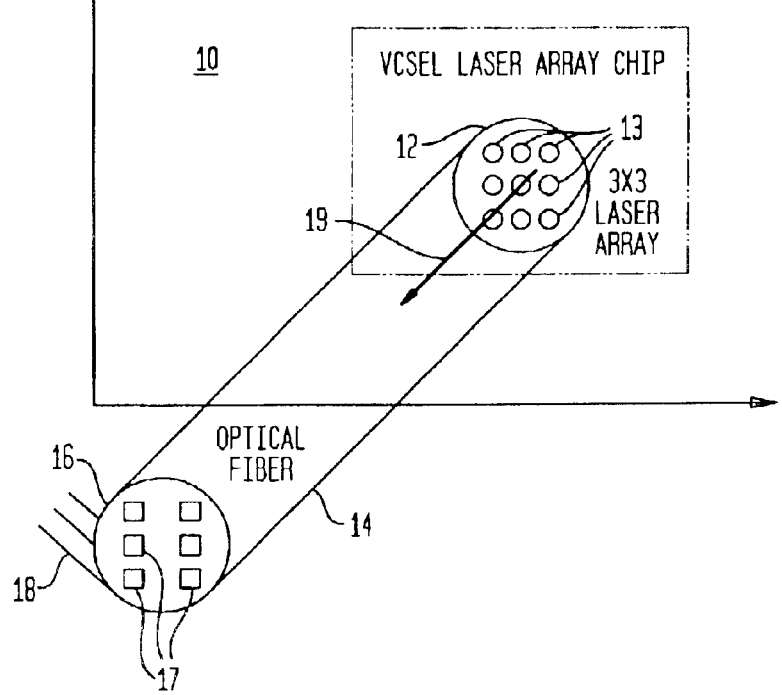
FIG. 1 illustrates a first embodiment of the present invention wherein a substrate or submount is provided with an optical source comprising a VCSEL laser array chip which is coupled to an optical fiber forming an optical path on a transmit side of an optical link extending to an optical detector on a receiver side of the optical link.

FIG. 1 illustrates a first embodiment of the present invention wherein a substrate or submount 10, such as a silicon or ceramic substrate, a multi-chip module, a package board, backplane or similar component, is provided with a VCSEL laser array chip 12 which comprises an array of individual lasers 13. The laser array chip is coupled to an optical fiber 14 forming an optical path on a transmit side of an optical link. An optical detector 16, such as an n×m array of photodiodes 17, is coupled to the optical path on the receiver side of the optical link, and is typically mounted on a second substrate or submount 18 such as a silicon or ceramic substrate, a multi-chip module, a package board, backplane or similar component. In a typical application, the optical communications may be provided inside a computer, such as between a backplane and a circuit board or between two circuit boards. In such an arrangement, coupling an optical source to an optical fiber is generally a more difficult problem than coupling an optical detector to an optical fiber as a single optical detector can be provided with a sufficiently large active area to capture almost all of the light from the optical fiber. The optical fiber to chip connector can be any typical prior art optical fiber to chip connector as is known in the art.

Optical laser technology has advanced to the point of providing arrays of VCSEL (vertical cavity surface emitting laser) laser sources fabricated with gallium arsenide and other compound semiconductor processes in semiconductor chips. The dimensions of a VCSEL laser array have been reduced in the present state of the art to an extent that multiple lasers on a VCSEL laser array chip can fit into the area of a multimode optical fiber core, as shown in FIG. 1.

FIG. 1 shows a 3×3 array of lasers, i.e., a VCSEL array, such as on a GaAs chip. The VCSEL laser array can be provided on a square grid as shown in FIG. 1, or it could also be provided on a hexagonal grid for higher packing density, or on some other grid geometry. The laser chip may support multiple optical links, only one of which is shown by arrow 19.

Figure 2:
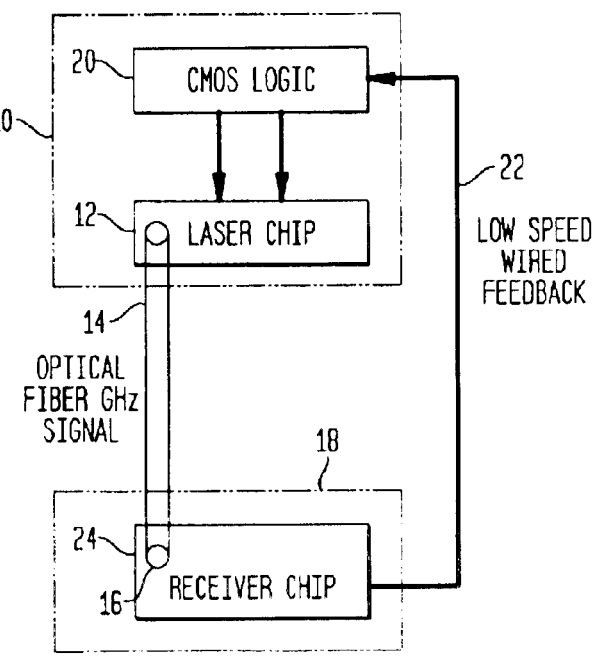
FIG. 2 illustrates a substrate or submount provided with a CMOS support logic control chip which feeds a GHz data signal to a laser array chip for transmission over an optical fiber, and is also used to select the best laser source in the laser array based on a feedback logic signal from receiver logic.

FIG. 2 illustrates a first substrate or submount 10 such as a silicon or ceramic substrate, a multi-chip module, a package board, backplane or similar component which is provided with a VCSEL laser array chip 12 and support logic control 20 for the VCSEL laser array chip. The support logic control is typically provided by a CMOS logic chip which feeds a GHz data signal to the laser chip for transmission over an optical fiber 14. The CMOS chip 20 selects the best laser source in the laser array based on a relatively low speed or data rate electrical feedback logic signal 22 from a receiver chip 24 mounted on a substrate or submount 26 such as a silicon or ceramic substrate, a multi-chip module, a package board, backplane or similar component, which also mounts an optical detector 16 thereon.

Many different schemes may be used to provide the feedback signal 22. The feedback signal can be provided when the link is first assembled, in which case the feedback signal need only be provided at the time of assembly, or it could be provided at any time when it is desired to reoptimize the coupling, in which case the feedback signal is likely to be a permanent feature.

Figure 3:
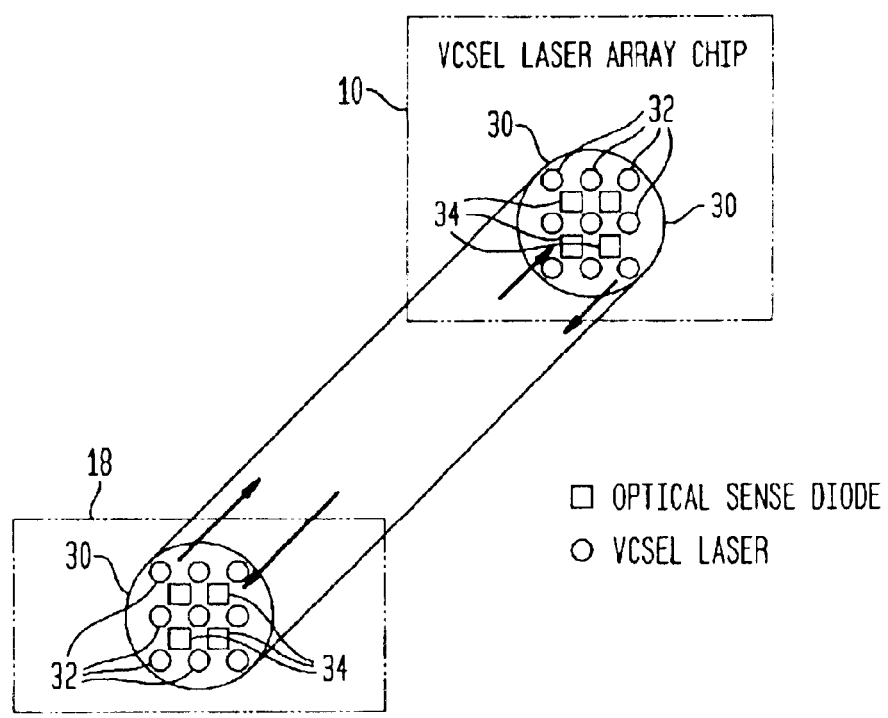
FIG. 3 illustrates an advantageous embodiment of the present invention which uses a single interwoven array chip having both a laser array of VCSEL lasers interwoven with a detector array of optical sense diodes which provide for bi-directional communications over a single optical fiber.

FIG. 3 illustrates a bi-directional communication system embodiment of the present invention which uses first and second single interwoven array chips 30 mounted on a first and second substrate 10, 12. Each interwoven array chip 30 has both a laser array having an array of VCSEL lasers 32 interwoven with a detector array of optical sense diodes 34. Each interwoven array chip 30 provides for bi-directional data communications over a single optical fiber 14. Moreover each interwoven array chip also provides the ability to "wrap" an optical signal at the receiver end of the optical communication link and return a signal back to the source laser array chip for use as an optical feedback signal in the source laser selection process. The signals generated directly by the photodiodes can be used at the receiver to select an efficiently coupled photodiode without the use of a feedback loop or signal.

In some embodiments, the laser elements 32 can be turned off when the chip is in a receive mode so as to avoid interference between received signals and transmitted signals. Switching between the received signals and the laser source(s) can be provided at a sufficiently fast rate such that a signal may be sent out on the fiber, and then the laser source(s) turned off while waiting for the wrap to occur and the optical feedback signal to be returned.

While several embodiments and variations of the present invention for a redundant configurable VCSEL laser array optical light source are described in detail herein, it should be apparent that the disclosure and teachings of the present invention will suggest many alternative designs to those skilled in the art.

Having thus described our invention, what we claim as new and desire to secure by Letters Patent is:

1. Apparatus for providing optical data signals over an optical data link comprising:

an array of surface emitting lasers provided in a single semiconductor chip which is mounted on a first substrate;

an optical detector mounted on a second substrate;

an optical data link connecting optical data signals from at least one laser of the array of lasers to the optical detector mounted on a second substrate; and a selection means for selecting one or more of the lasers in the array of surface emitting lasers for optical coupling to the optical data link based on the best aligned and coupled laser to provide the best laser signal from an array of surface emitting lasers, including logic means for directing a GHz signal to the semiconductor chip for transmission over the optical data link, and also for selecting one or more lasers in the array of surface emitting lasers based on a feedback signal received from a receiver indicating the best aligned and coupled laser of the array of surface emitting lasers.

2. The apparatus of claim 1, wherein the array of lasers comprises an array of vertical cavity surface emitting laser (VCSEL) lasers.

3. The apparatus of claim 1, wherein at least one of the first and second substrates comprises a circuit board.

4. The apparatus of claim 1, wherein at least one of the first and second substrates comprises a backplane.

5. The apparatus of claim 1, wherein at least one of the first and second substrates comprises a silicon substrate.

6. The apparatus of claim 1, wherein the at least one of the first and second substrates comprises a ceramic substrate.

7. The apparatus of claim 1, wherein the feedback signal comprises an electrical feedback signal.

8. The apparatus of claim 1, wherein the feedback signal comprises an optical feedback signal.

9. The apparatus of claim 1, wherein the optical data link comprises an optical fiber.

10. The apparatus of claim 1, wherein the optical data link comprises a free space optical path.

11. The apparatus of claim 1, wherein the array of lasers supports multiple simultaneous optical communication data links over a plurality of optical data links, each having its own laser and own detector.

12. The apparatus of claim 1, wherein the logic means comprises a logic chip which directs a GHz data signal to the semiconductor chip for transmission over the optical data link, and also selects one or more lasers in the array of surface emitting lasers.

13. The apparatus of claim 1, including an array of optical detectors to provide at least one feedback signal for the laser selection.

14. The apparatus of claim 1, wherein the array of lasers is provided on a single interwoven array chip provided on the first substrate and having both an array of VCSEL lasers interwoven with a detector array of optical sense diodes which provide bi-directional communications over the optical data link including a returned optical feedback signal used in the laser selection for the chip.

15. The apparatus of claim 14, including a second single interwoven array chip provided on the second substrate and having both an array of VCSEL lasers interwoven with a detector array of optical sense diodes which provide bi-directional communications over the optical data link including a returned optical feedback signal used in the laser selection for the second chip.

16. Apparatus for providing optical data signals over an optical data link comprising:

an optical light source which is mounted on a first substrate;

an optical data link connecting optical data signals from the optical light source to an array of optical detectors provided in a single semiconductor chip mounted on a second substrate; and a selection means for selecting one or more of the optical detectors in the array of optical detectors for optical coupling to the optical data link based on the best aligned and coupled optical detector providing the best signal from the array of optical detectors, including logic means for directing a GHz signal to the semiconductor chip for transmission over the optical data link, and also for selecting one or more lasers in the array of surface emitting lasers based on a feedback signal received from a receiver indicating the best aligned and coupled laser of the array of surface emitting lasers.

17. The apparatus of claim 16, wherein the array of optical detector comprises an array of photodiodes.

* * * * *